United States Patent
Smith

(10) Patent No.: US 6,462,532 B1
(45) Date of Patent: Oct. 8, 2002

(54) AUTOMATED TESTING EQUIPMENT HAVING A MODULAR OFFSET TEST HEAD WITH SPLIT BACKPLANE

(75) Inventor: Edward E. Smith, San Jose, CA (US)

(73) Assignee: Third Millennium Test Solutions, San Jose, CA (US)

( * ) Notice: Subject to any disclaimer, the term of this patent is extended or adjusted under 35 U.S.C. 154(b) by 0 days.

(21) Appl. No.: 09/479,507

(22) Filed: Jan. 7, 2000

(51) Int. Cl.$^7$ .................................................. G01R 1/02
(52) U.S. Cl. .................................................. 324/158.1
(58) Field of Search ........................... 324/158.1, 73.1, 324/755, 765, 72.5; 361/683, 686, 748, 760, 792, 807

(56) References Cited

U.S. PATENT DOCUMENTS

| | | | | |
|---|---|---|---|---|
| 5,001,422 A | * | 3/1991 | Dahlbwerg et al. | 324/73.1 |
| 5,216,361 A | * | 6/1993 | Akar et al. | 361/384 |
| 5,268,637 A | * | 12/1993 | Liken et al. | 324/537 |
| 5,747,994 A | | 5/1998 | Suga | 324/754 |
| 5,936,417 A | | 8/1999 | Nagata | 324/754 |
| 5,986,447 A | | 11/1999 | Hanners et al. | 324/754 |
| 5,986,458 A | | 11/1999 | Saito et al. | 324/754 |

* cited by examiner

Primary Examiner—Vinh P. Nguyen
(74) Attorney, Agent, or Firm—Nguyen & Associates

(57) ABSTRACT

A modular offset Automated Testing Equipment (ATE) test head with split backplane is presented. The ATE test head is modularized into a card cage module having a first backplane for accommodating general purpose instrument cards and a cassette module having a second backplane that is offset relative to the first backplane for accommodating personality (specific purpose) instrument cards. The general purpose instrument cards and the personality instrument cards communicates with each other by cables connecting them. The general purpose instrument cards and personality instrument cards can be quickly disengaged from and engaged to the respective backplanes individually or concurrently. Because of this latter feature, a cassette module can be easily and rapidly disengaged from the card cage module and a different cassette module can be easily and rapidly engaged to the card cage module. In so doing, the test head can be easily and rapidly reconfigured to perform different test functions without any ATE down time. When attached to the card cage, the cassette module extends beyond the card cage's boundary along one direction to form a platform. This platform provides the interface to a Device Under Test (DUT) board. As a result of the modularity of the three major elements: card cage, cassette module, and split backplanes that together form a ATE test head, rapid and accurate attachment to and removal from a variety of IC handlers and probers are facilitated.

15 Claims, 7 Drawing Sheets (SIDE VIEW)

(SIDE VIEW)

(TOP VIEW)

(REAR VIEW)

(FRONT VIEW)

(OPEN CONFIGURATION)

AUTOMATED TESTING EQUIPMENT HAVING A MODULAR OFFSET TEST HEAD WITH SPLIT BACKPLANE

FIELD OF THE INVENTION

The invention relates generally to automatic test equipments, and more particularly to the structural design of remote test heads.

BACKGROUND OF THE INVENTION

To provide quality assurance, semiconductor device makers systematically perform tests on their products to ensure that they meet or exceed all of their design parameters. Some of the types of tests routinely performed include device parametric testing (a.k.a. DC testing), device logic function testing, and device timing testing (a.k.a. AC testing). The semiconductor device being tested is commonly known as the Device Under Test (DUT) and the test system used in conducting the above tests on the DUT is commonly known as Automatic Test Equipment (ATE). In carrying out the aforementioned tests on very sensitive DUTs, the ATE is necessarily very precise. In general, the ATE hardware is controlled by a computer which executes a test program to present the correct voltages, currents, timings, and functional states to the DUT and monitor the response from the device for each test. The result of each test is then compared to pre-defined limits and a pass/fail decision is made. As such, the ATE hardware normally includes a collection of power-supplies, meters, signal generators, pattern generators, etc. The Pin Electronics (PE) circuitry provides the interface between the ATE and the DUT.

U.S. Pat. No. 4,517,512 to Petrich et al. (hereinafter the '512 patent) shows an example of a prior art rack-and-stack ATE. As shown in FIG. 1 of the '512 patent, a control computer including display, power supplies, I/O peripherals (e.g., data storage drives, printers) are stacked on top of each other in a rack console which may be 19 inches wide. The ATE has a remote test head module which carries the instrument cards designed to provide voltages, currents, timings, and functional states to the DUT and to monitor the responses. A cable links the remote test head module to the equipments in the rack console to supply power from the rack console to the remote test head module as well as to allow the transfer of data and control/command signals between the rack console and the remote test head module. During testing, the remote test head module is attached to a test fixture underneath a prober/handler also attached to the test fixture. The prober/handler is used to hold the DUT and to position the DUT relative to the remote test head module. As computers and testers move into the gigahertz range, corresponding wavelengths are a few millimeters. At such wavelengths, almost any wire is an antenna causing signal radiation. Also, ATEs are now working with lower power levels, with currents in the microampere range. This increases the effects of electrical noise. Where higher powers are used to offset noise, transmission line losses occur thereby reducing efficiency. An advantage of this invention is that the distance from the instrument cards in the test head module to the DUT is kept reasonably short to reduce signal radiation, to improve the signal-to-noise ratio, and to reduce transmission line losses.

The instrument cards in the remote test head module are electrically and mechanically connected to each other in a stack-like fashion wherein a male connector on an instrument card is connected to a corresponding female connector on an immediately adjacent instrument card and so on. The connection established by connectors allow the instrument cards to communicate to each other. The instrument cards are connected to the rack console by the cable. The instrument card on top of the stack (a.k.a. the master instrument card) is connected to as many as 64 PE cards. To accommodate 64 PE cards, connectors are arranged in a circle on top of the master instrument card. A disadvantage in connecting instrument cards in a stack is that it does not allow for replacing an instrument card in the stack without disassembling and reconfiguring the instrument card stack. Such disassembly and reconfiguration are likely to result in down time for the ATE which may be undesirable. Another disadvantage in relying on connectors to mechanically connect instrument cards in a stack is that it limits the number of instrument cards that can be stacked and therefore the number of tests that can be carried out by the ATE. While additional mechanical fasteners may be used to secure the instrument cards together thereby allowing more cards to be stacked on top of each other, such fasteners increase costs as well as making it more difficult and time consuming to replace an instrument card.

To accommodate the increase number of tests performed by an ATE (e.g., in linear and mixed signals testing) as well as to improve the ability to replace instrument cards and/or reconfigure the test module rapidly, an approach has been developed wherein instrument cards with connectors are connected to corresponding connectors on a backplane such that the instrument cards are parallel to each other. In so doing, any instrument card can be removed and replaced quickly and easily. A prior art ATE 100 that employs this backplane approach is the ASL1000 that is manufactured by TMT Inc. of Sunnyvale, Calif. which is illustrated in FIG. 1.

As shown in FIG. 1, remote test head module 101 is controlled by central processing unit (CPU) 111 with display monitor 112 and keyboard 113. Power supply 114 supplies the required power to remote test head module 101 which interfaces with DUT 106. Remote test head module 101 includes back plane 102 having up to twenty-one (21) parallel connectors on one side into which twenty-one instrument cards 103 are plugged. To converge the signals from twenty-one proprietary instrument cards 103 into a small test area that interfaces with DUT 106, the opposite side of backplane 102 is connected to system interconnect board 104. On the opposite side of backplane 102, there are six (6) 96-pin connectors 107 to which six corresponding 96-pins connectors 108 of system interconnect board 104 are plugged. System interconnect board 104 is in turn connected to DUT board 105. Accordingly, on the opposite side of system interconnect board 104 there are a plurality of connectors 109 to which corresponding connectors 110 of DUT board 105 are connected.

In this prior art ATE system, any individual instrument card 103 can be easily and rapid replaced. However, when replacement of a large number of instrument cards is involved, it may be necessary to remove interconnect board 104 from backplane 102 (e.g., for reconfiguration). This is quite challenging given the force required to simultaneously disengage/engage all five-hundred-seventy-six (6×96) pins of six connectors that connect backplane 102 to system interconnect board 104. Accordingly, mechanical assistance may be required. Even with such a mechanical tool, it is still difficult to remove and replace interconnect board 104 rapidly.

Moreover, a test head module that is designed to seat multiple instrument cards like test head module 101 can be rather large in terms of size and weight (as much as 200 lbs)

which makes it very difficult to move it close to a DUT let alone maneuvering, even with mechanical aids (e.g., manipulator, wheels, etc.), the test head module in a precise manner to properly connect the test head module with the DUT. As such, it may be necessary to connect PE circuitry to the test head module by a cable to get close to the DUT. This almost always degrades the signals.

Thus, a need exists for an ATE test head module that houses a large number of instrument cards, that allows for rapid reconfiguration of a backplane and replacement of instrument cards, as well as can be placed in close proximity with a DUT without requiring a mechanical manipulator and without requiring strenuous forces in reconfiguring the test head module.

SUMMARY OF THE INVENTION

Accordingly, the present invention provides an Automated Test Equipment (ATE) test head module that houses a large number of instrument cards, that allows for rapid reconfiguration of a backplane and replacement of instrument cards, as well as can be placed in close proximity with a DUT without requiring a mechanical manipulator and without requiring strenuous forces in reconfiguring the test head module.

The present invention meets the above objectives with an ATE test head module that comprises a card cage, and a cassette module mechanically joined to the card cage such that the cassette module can be quickly and easily removed from the card cage. The card cage has first backplane (a.k.a. PXI backplane) that is mechanically and electrically connected to a first set of circuit cards such that any card of the first set of circuit cards can be quickly and easily removed from the first backplane. The first backplane is electrically coupled to a Central Processing Unit (CPU).

The cassette module has a second backplane that is mechanically and electrically connected to a second set of circuit cards such that any card of the second set of circuit cards can be quickly and easily removed from the second backplane. The cassette module is designed to hold a Device Under Test (DUT) circuit board for interfacing with a DUT. The first set of circuit cards are in communications with the second set of circuit cards. In an embodiment, the cassette module extends beyond the card cage to form a platform for holding the DUT circuit board. The platform has a cutout with an access door on a rear side allowing access to the second backplane and a through hole in the second backplane to allow visual contact and access to the DUT. Such visual contact is important during various activities such as handler and prober docking, and prober wafer alignment. When closed, the access door prevents light and electrical interference from affecting the DUT.

In one embodiment, the card cage has a cavity and an access opening for accommodating the second set of circuit cards when the cassette module is mechanically joined to the card cage. The first set of circuit cards is industry standard general-purpose instrument cards and the second set of circuit cards are proprietary personality instrument cards conforming to industry standards.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

In accordance with the present invention, an Automated Testing Equipment (ATE) test head is modularized into a card cage module having a first backplane for accommodating general purpose instrument cards and a cassette module having a second backplane that is offset relative to the first backplane for accommodating personality (specific purpose) instrument cards. The general-purpose instrument cards and the personality instrument cards communicate with each other by cables connecting them. The general-purpose instrument cards and personality instrument cards can be quickly disengaged from and engaged to the respective backplanes individually or concurrently. This allows the cassette module to be quickly and easily attached to and detached from the card cage module without requiring strenuous forces. Because of its relatively lightweight and small size, a cassette module in accordance to the present invention is very maneuverable. The test head can also be easily and rapidly reconfigured to perform different test functions without almost no ATE down time. When attached to the card cage, the cassette module extends beyond the card cage's boundary along one direction to form a platform. This platform provides the interface to a Device Under Test (DUT) board. A through hole is provided in the platform to provide visual alignment of the cassette module relative to the DUT and allow direct connections with the DUT by external instruments.

Figure 1:
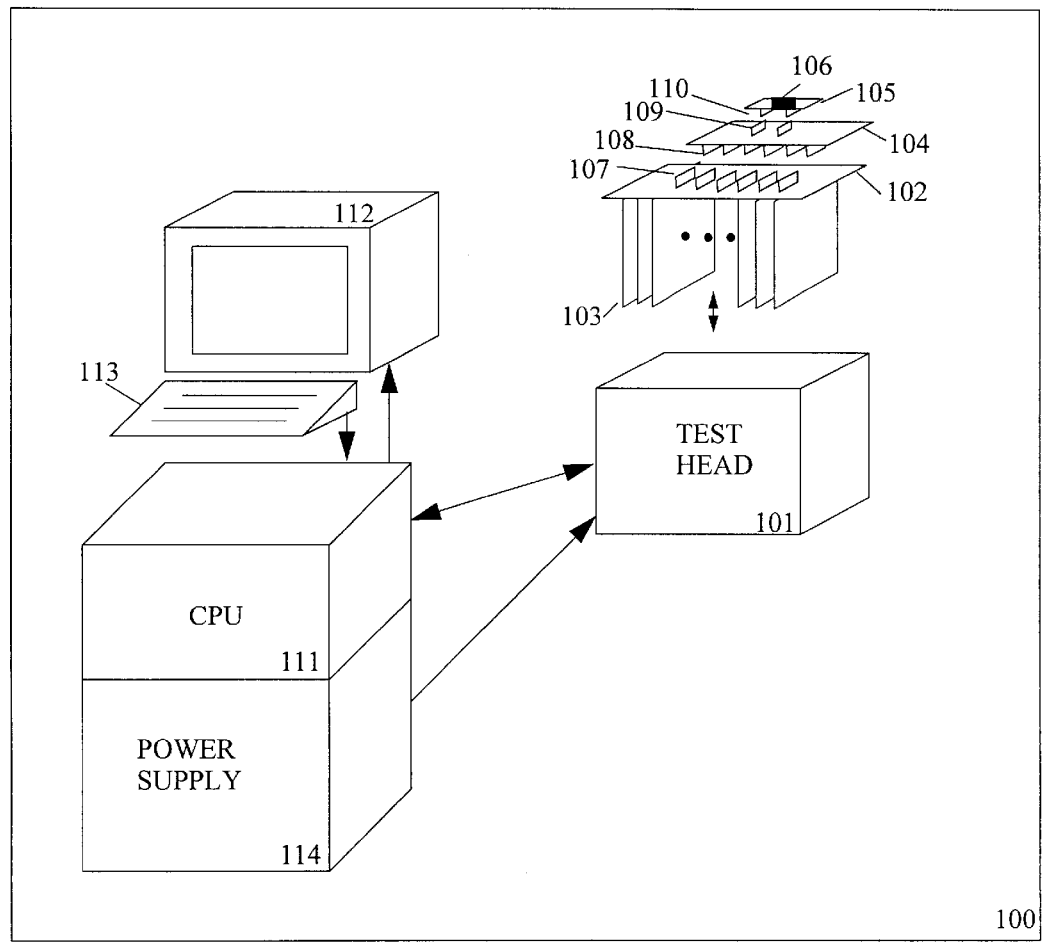
FIG. 1 is a block diagram illustrating a prior art ATE system.
Figure 2:
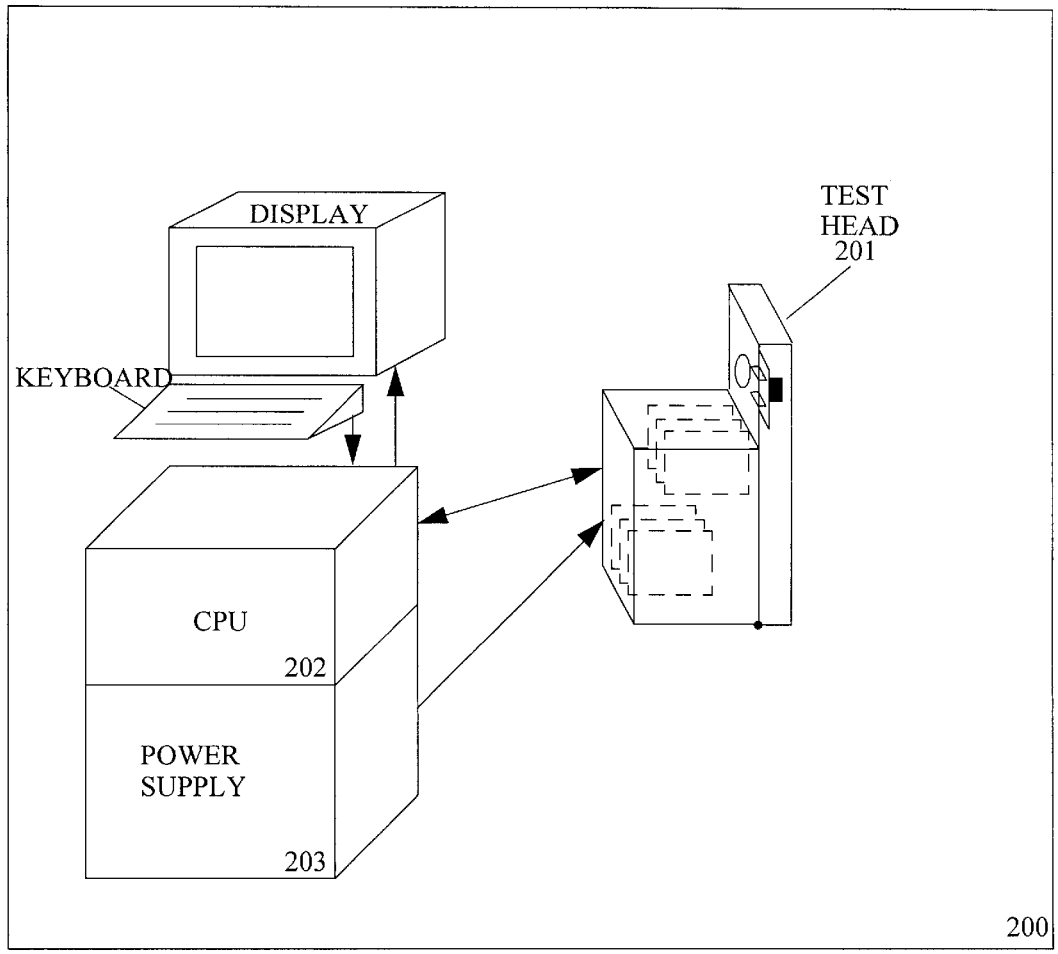
FIG. 2 illustrates a block diagram of ATE 200 in accordance with the present invention.

Reference is now made to FIG. 2 illustrating a high-level diagram of computer controlled Automatic Test Equipment (ATE) 200 that implements the present invention. ATE 200 comprises remote test head 201, computer system 202, and system power supplies 203. Computer system 202 is the system controller. Computer system 202 controls remote test head 201 which is electrically linked to computer system 202 by an electrical cable. Computer system 202 also acts as a hub to transfer data to/from ATE 200. Hence, computer system 202 may generally include a central processing unit (CPU), input/output (I/O) interfaces such as parallel and serial ports, communications interface for networking and communicating with the outside world, video/graphics controller, a number of data storage devices such as hard drive and tape drive for locally storing information, I/O devices such as keyboard and video monitor to allow the operator to interact with ATE 200. It is to be appreciated that computer system 202 can be any one of a number of different computer systems including desk-top computer systems, general purpose computer systems, embedded computer systems, and others. Remote test head 201 carries all the instrument circuitry cards required to generate forced test signals and to monitor responded signals from the DUT before sending them to computer system 202 for analysis. Accordingly, remote test head 201 is used to interface with the DUT. By having the instrument cards in remote test head 201, the instrument cards are ensured that they will be in close proximity with the DUT thereby minimizing the adverse effects associated with running a cable from the instrument cards located a distance away to the DUT which may include high signal radiation, low signal-to-noise ratio, and transmission line losses.

System power supplies 203 provide steady and uninterrupted direct current (DC) power to test head 201. Depending on its test purposes, it is to be appreciated that an ATE may have more or fewer than the components discussed above. Further, it should be clear that the components of the ATE discussed above are conventional and well known by people of ordinary skill in the art.

Figure 3:
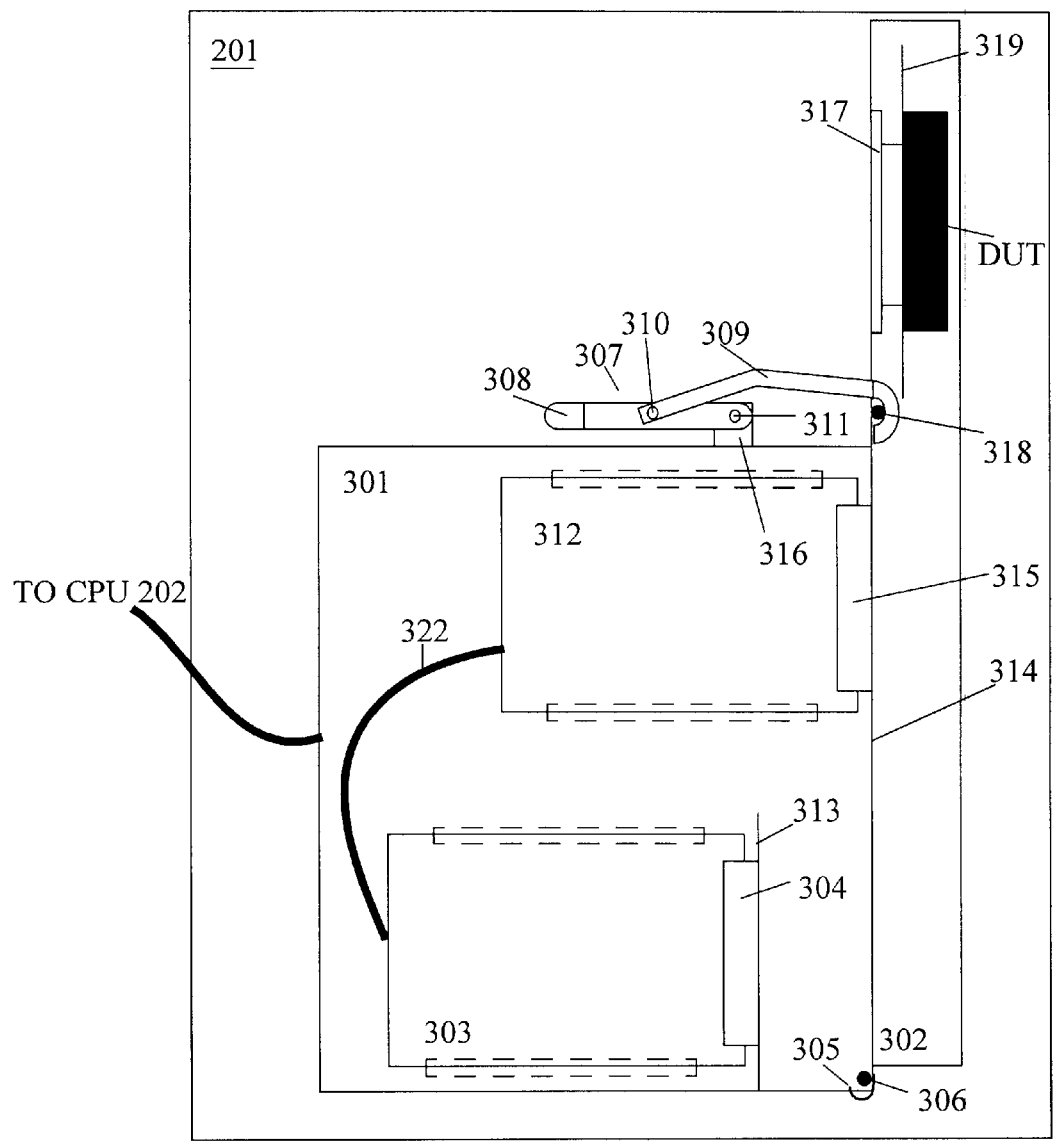
FIG. 3 illustrates in greater detail remote test head 201 of FIG. 2 in accordance with the present invention.

Referring now to FIG. 3 illustrating in greater detail a remote test head 201 in accordance with the present invention. As shown in FIG. 3 (a side view of remote test head 201), remote test head 201 comprises a portable card cage 301 and a portable cassette module 302. Card cage 301 houses general purpose instrument cards 303 which are plugged into backplane 313 that is fastened to card cage 301. More specifically, general instrument cards 303 are plugged into connectors 304 that are connected to backplane 313 (a.k.a. PXI backplane). While card cage 301 also "houses" personality instrument cards 312, personality instrument cards 312 are not plugged into backplane 313 of card cage 301. As discussed in greater detail below, personality instrument cards 312 are plugged via connectors into a second backplane that is part of cassette module 302. In other words, the traditional backplane is split into two backplanes in the present invention. When personality instrument cards 312 are disengaged from the backplane of cassette module 302 (i.e., backplane 314), they may remain in card cage 301 (kept in place by slot guides) or they may be removed completely from card cage 301. By splitting the traditional backplane and allowing individual personality instrument cards 312 to easily disengage from backplane 314, no strenuous forces are required in detaching card cage 301 from cassette module 302, or vice versa.

General-purpose instrument cards 303 are used to produce electrical signals (e.g., voltages, currents, timing functions, etc.) that are generally required in substantially all of the tests performed using ATE. In other words, general purpose instrument cards 303 act as resources for personality instrument cards which are used for specific test functions. Conversely, personality instrument cards 312 are used to generate test functions that are particular to a specific test. In generating the test functions, personality instrument cards 312 may employ the electrical signals generated by general purpose instrument cards 303. Backplane 313 only extends about half the length of the bottom side of card cage 301. As such, there is an access opening into card cage 301 that begins where backplane 313 ends. Such an access opening is used to allow personality instrument cards 312 to be plugged into the backplane 314 of cassette module 302. To maximize the number of general-purpose instrument cards 303 that can be accommodate by backplane 313 as well as facilitate the insertion and removal of general instrument cards 303 to/from backplane 313, connectors 304 are arranged so that they are parallel to each other. When general instrument cards 303 are plugged into connectors 304, they are both mechanically and electrically connected to backplane 313 which in turn is electrically connected to computer system 202.

In FIG. 3, cassette module 302 is shown locked to card cage 301. However, card cage 301 is designed such that it can be easily and rapidly latched to or disengaged from cassette module 302, or vice versa. While cassette module 302 is likely attached to a device handler (fixture) during test, card cage 301 is free to swing open or close relative to cassette module 302 thereby providing access to instrument cards, backplanes, and others as well as allowing a rapid exchange of cassette module 302. In one embodiment, cassette module 302 has an upward-curved slot 305 located at one end of cassette module 302 and extends across the width of cassette module 302. Hinge pir 306, which is attached to and extends across the width of card cage 301, is designed to hook into slot 305 that is at the lower corner of cassette module 302 and extends across the width of cassette module 302 thereby allowing card cage 301 to pivot and rotate about slot 305 of cassette module 302 to swing close or open. To allow card cage 301 to easily and rapidly disengage from cassette module 302, which may be attached to a handler equipment, hinge pine 306 is designed so that card cage 301 can be easily removed from slot 305. To attach card cage 301 to cassette module 302 (or vice versa), hinge pin 306 is first hooked onto slot 305 thereby allowing one end of card cage 301 to hang on and be supported by slot 305. This allows the user to easily pull the free end of cassette module 302 up, even with just one hand given the weight of cassette module 302, to attach cassette module 302 to card cage 301. Personality instrument cards 312 are then inserted individually into the corresponding connectors on backplane 314. To detach card cage 301 from cassette module 302 (or vice versa), personality instrument cards 312 are first disengaged individually from backplane 314. Card cage 301 is then unlatched from cassette module 302 thereby allowing card cage 301 to swing open relative to cassette module 302 about slot 305. By disengaging personality instrument cards 312 first, less force is required to disengage card cage 301 from cassette module 302 (or vice versa).

Figure 3A:
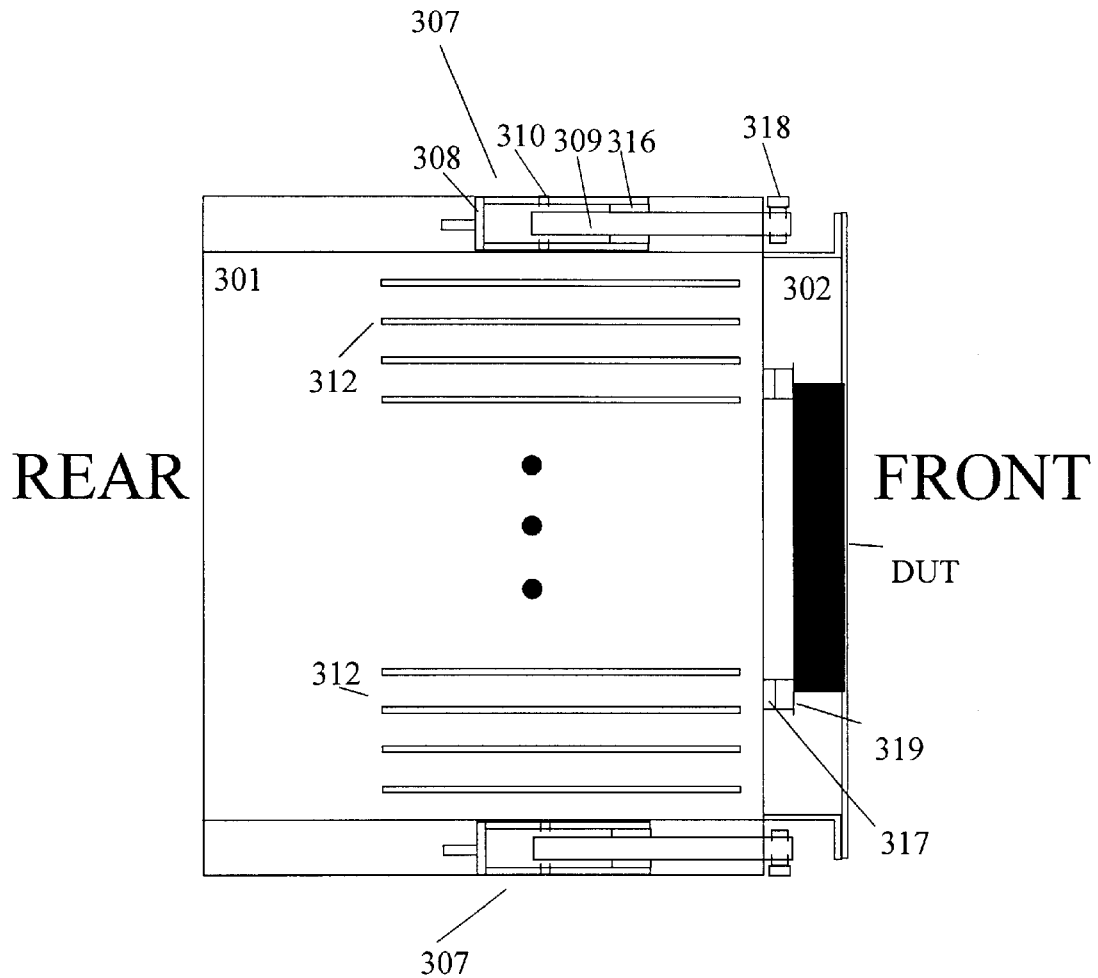
FIG. 3A illustrates a top view of remote test head 201.
Figure 4:
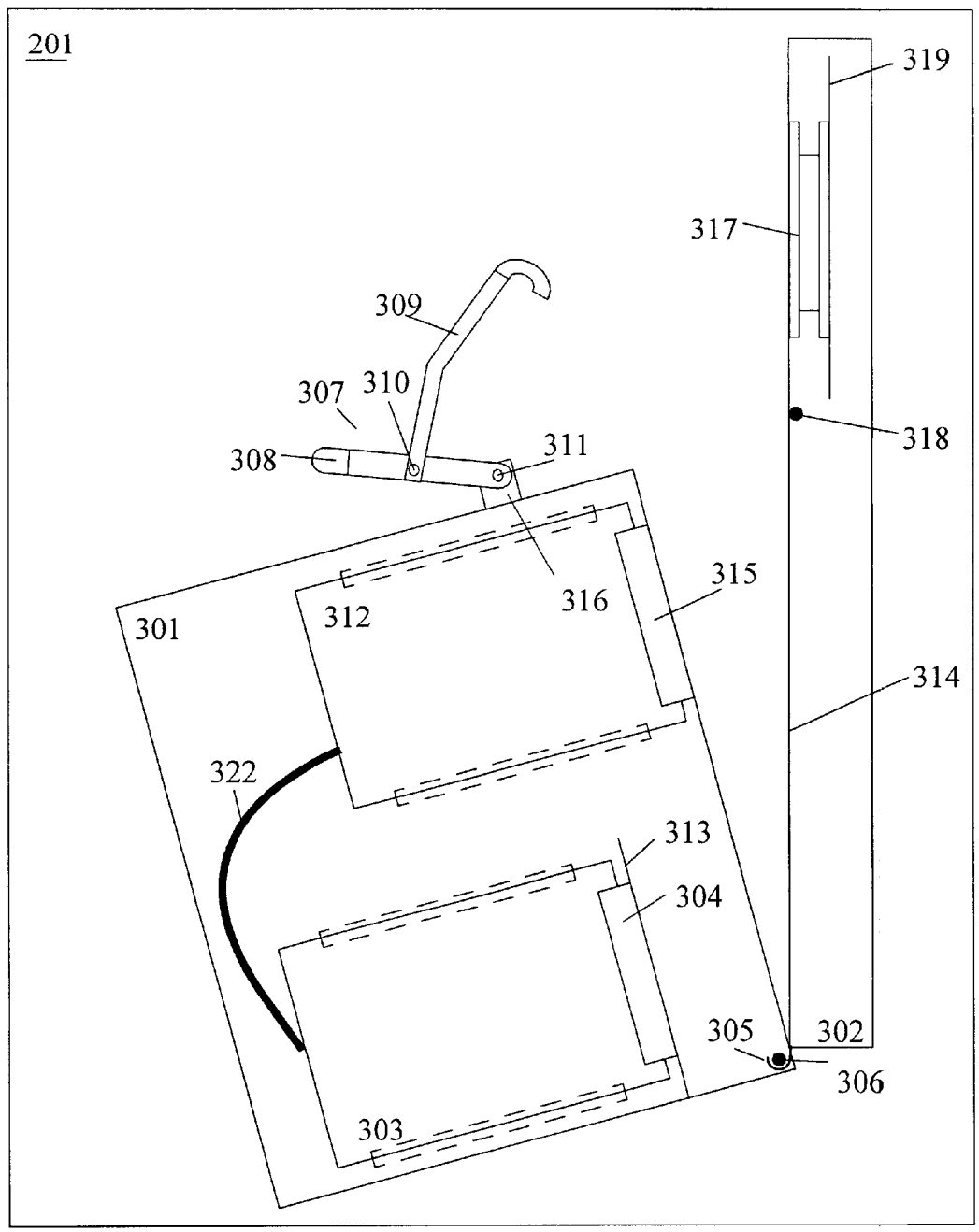
FIG. 4 shows the scenario in which card module 301 is released from its latched position relative to cassette module 302 that may be attached to a handler device.

Latch mechanisms 307 are used to lock cassette module 302 in place relative to card cage 301 in the locked (close) position. FIG. 3A, which is a top view of remote test head 201 (i.e., a top view of FIG. 3), illustrates the relative placement of latch mechanisms 307. In one embodiment, each latch mechanism 307 comprises lever member 308 and hook member 309. Lever member 308 is attached and pivoted at one end to flange 309 that is fastened to a side flange of card cage 301. As such, lever member 308 is free to rotate relative to pivot point 310 that is connects lever 308 to flange 316. Hook member 309 is attached and pivoted at one end to approximately the midpoint of lever member 308 thereby allowing hook member 309 to rotate relative to lever member 308 about pivot point 311. As its name suggested, hook member 309 has a hook at the free end. In so doing, latch mechanism provides two degrees of freedom to allow the hook of hook member 309 to move freely to engage and disengage with pin 318 in cassette module 302. To lock cassette module 302 in place relative to card cage 301, lever member 308 is pulled down to lower hook member 309. Because hook member 309 is also free to rotate about pivot point 311, hook member 309 also has lateral movements. The vertical and lateral movements allow the hook of hook member 309 to find and engage with pin 318. At this point, lever member 308 is pushed up to raise hook member 309 which latches cassette module 302 in place relative to card cage 301. To release cassette module 302 relative to card cage 301, lever member 308 is pulled down to lower hood member 309 which is in turn rotated about pivot point 311 to free it from pin 318 thereby releasing cassette module 302. It should be clear to a person of ordinary skill in the art that other types of latch mechanisms can also be employed and still be within the scope of the present invention. For illustration purpose, FIG. 4 shows cassette module 302 in its released configuration relative to card module 301. However, in FIG. 4, cassette module 302 is still hooked onto hinge pin 306 of card cage 301 by slot 305. To completely detach cassette module 302 from card cage 301, slot 305 still needs to be unhooked from hinge pin 306 which is easy to do. From this position, cassette module 302 can easily be lifted up by the user, using only one hand, to be latched to card cage 301.

Figure 3B:
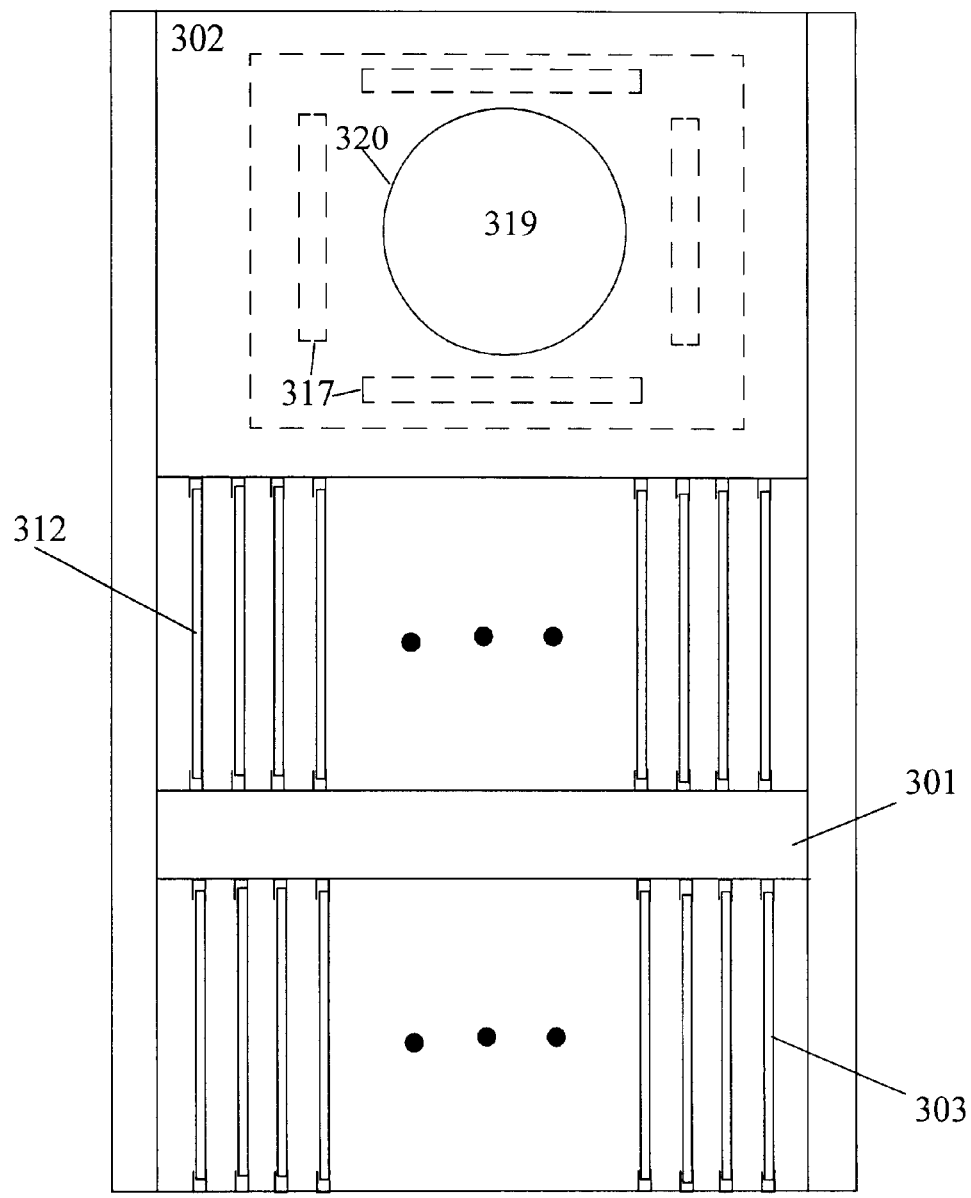
FIG. 3B illustrates a rear view of remote test head 201.
Figure 3C:
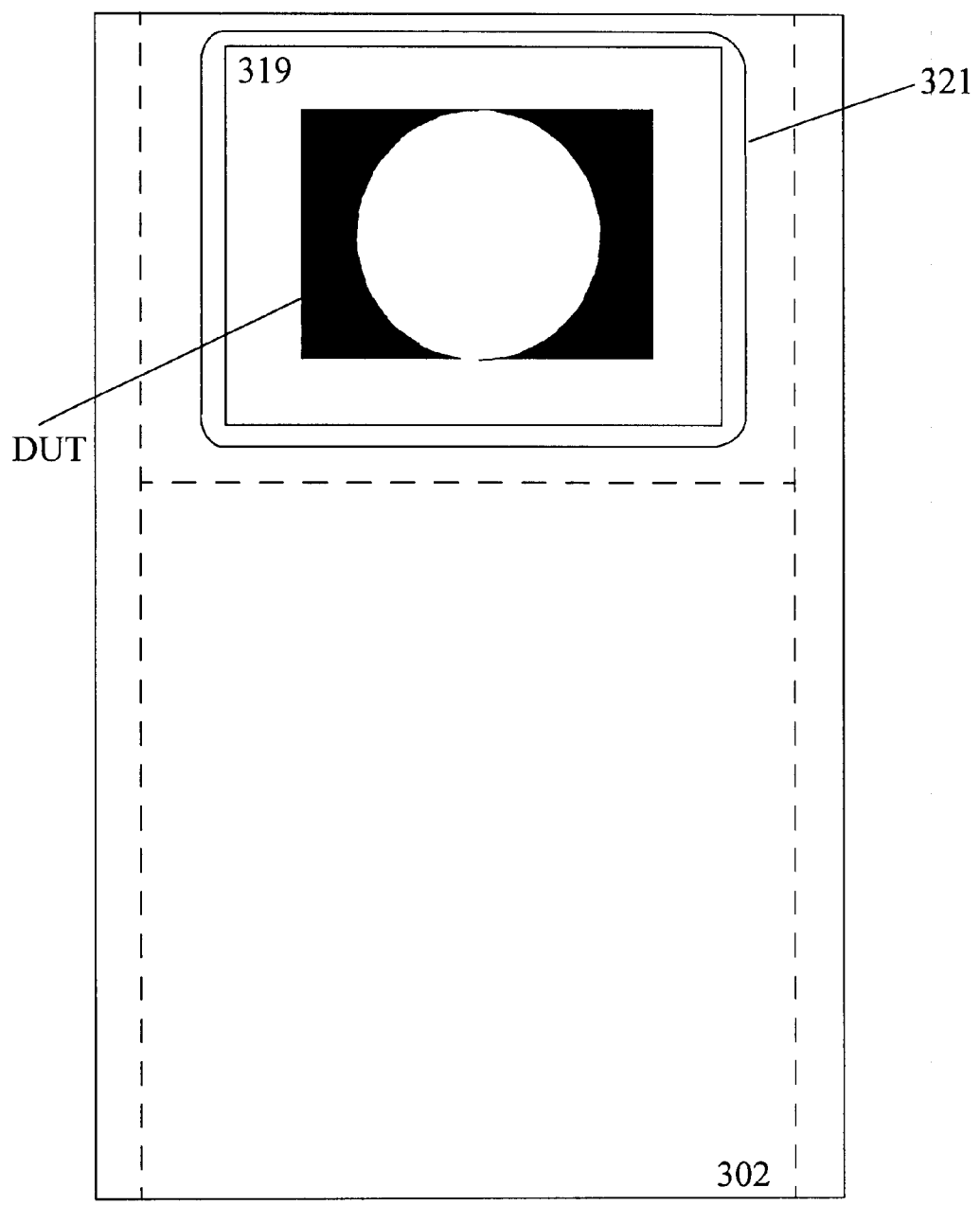
FIG. 3C illustrates a front view of remote test head 201.

Referring now back to FIG. 3, as discussed earlier, cassette module 302 has a different backplane 314 that is offset relative to backplane 313 of card cage 301. In other words, backplanes 313 and 314 are in different planes. Like backplane 313, backplane 314 has a row of connectors 315 arranged in parallel to accommodate a greater number personality instrument cards 312 as well as to allow them to be easily and quickly engaged/disengaged to/from backplane 314 on an individual basis. Personality instrument cards 312 may be connected to selected general purpose instrument cards 303 by cables 322 so that common test functions generated by general purpose instrument cards 303 can be shared by different personality instrument cards 312. In addition to serving as an interface with a DUT board, backplane 314, which is attached to cassette module 302, also acts as the top side of cassette module 302. Cassette module 302 extends beyond the boundary of card cage 301 along one direction to form a platform. This platform provides the interface to a DUT card. As shown in FIG. 3B, which is a back view of remote test head 201, through hole 320 is provided in backplane 314 to provide visual alignment of cassette module 302 relative to the DUT board, to facilitate probe card/wafer alignment, and provide direct connections with the DUT by external instruments. DUT board connectors 317 are provided on the front side of backplane 314 and in the proximity of through hole 320 to connect backplane 314 to corresponding connectors from DUT board 319 which is in contact with the DUT. When DUT board 319 is plugged into backplane 314, they are both mechanically and electrically connected to backplane 314 which in turn is electrically connected to personality instrument cards 312 and computer system 202. As shown in FIG. 3C, a front view of remote test head 201, cutout 321 is provided in the front panel of cassette module 302 to allow DUT board 319 access to the DUT board connectors 317. Cutout 321 may be equipped with an access door so that when closed, the access door prevents light and electrical interference from affecting the DUT during various activities.

In accordance with the present invention, because cassette module 302 may be replaced in seconds, the ATE user may have multiple numbers of cassette modules 302, backplanes 314, and DUT boards 319 which are configured ahead of time for different requirements of different kinds of tests and for different DUTs. Referring to FIG. 3, the configurations of cassette modules 302 may be different in terms of connections, number of personality instrument cards 312, types of personality instrument cards, and others. When the time comes to reconfigure test head module 201 for a particular test of a particular DUT, personality instruments cards 312 are disengaged from backplane 314 which can easily and quickly done in accordance with the present invention. By disengaging personality instrument cards 312 from backplane 314, card cage 301 and cassette module 302 can be readily detached from each other. Upon detachment from card cage 301, cassette module 302 consequently becomes much lighter and smaller in size therefore more maneuverable. The independent maneuverability of cassette module 302 is very desirable when it comes to aligning cassette module 302 relative to DUT board 319 (with a DUT) which may be attached to a device handler (fixture) or prober. Such maneuverability is also desirable in the alternate attachment approach wherein the DUT board 319 (with a DUT) is already attached to cassette module 302 before cassette module 302 is brought to the proximity of the handler. Card cage 301 and cassette module 302 may be made out of aluminum sheet metal or composites materials which make them very light. Cassette module 302 without the personality instrument cards may weigh five (5) lbs or less. Depending on the test, the disengaged personality instrument cards 312 may be left in card cage 301 for subsequent uses or they may be replaced by different cards. Latch mechanism 307 (or another latch mechanism) is then used to quickly release cassette module 302 from its latched condition with card cage 301. Hinge pin 306 is then disengaged from slot 30 to completely separate card cage 301 from cassette module 302. A different cassette module 302 can then be attached to card cage 301 in the reverse order within seconds compared to upward of 15 minutes as in the past. In so doing, no extended down time of the ATE is necessary and no excess force is required beyond the normal insertion and removal force of individual instrument cards for test head reconfiguration.

An embodiment of the present invention, an ATE test head module that houses a large number of instrument cards, allows for rapid reconfiguration of a backplane and replacement of instrument cards, as well as can be placed into close proximity with a DUT without requiring a mechanical manipulator, is thus described. While the present invention has been described in a particular embodiment, the present invention should not be construed as limited by such an embodiment, but rather construed according to the below claims.

What is claimed is:

1. An automated Test Equipment (ATE) test head comprising:
   a card cage having a first backplane that is mechanically and electrically connected to a first set of circuit cards, the first backplane is electrically coupled to a Central Processing Unit (CPU); and
   a cassette module mechanically joined to the card cage, the cassette module having a second backplane that is mechanically and electrically connected to a second set of circuit cards, the second backplane at least electrically connected to a Device Under Test (DUT) circuit board for interfacing with a DUT, the first set of circuit cards are in communications with the second set of circuit cards, any card from the second set of circuit cards is removable from the second backplane, the cassette module is removable from the card cage.

2. The ATE test head of claim 1, wherein any card from the first set of circuit cards is removable from the first backplane.

3. The ATE test head of claim 2, wherein the first set of circuit cards are general purpose instrument cards and the second set of circuit cards are personality instrument cards.

4. The ATE test head of claim 2, wherein the cassette module extends beyond the card cage to form a platform for holding the DUT circuit board, the platform having a cutout on a rear side allowing access to the second backplane, the platform further having a through hole in the second backplane thereby allowing visual contact and access to the DUT site.

5. The ATE test head of claim 4, wherein the cutout has an access door so that when closed, the access door prevents light and electrical interference from affecting the DUT during various activities.

6. The ATE test head of claim 2, wherein the card cage has a cavity and an access opening for accommodating the second set of circuit cards when the cassette module is mechanically joined to the card cage.

7. The ATE test head of claim 6, wherein the cassette module is mechanically joined to the card cage by a pair of hook-pin mechanisms and a pair of latch mechanisms, wherein the hook-pin mechanisms allowing the card cage to pivot and freely swing close or open relative to the cassette module, the latch mechanisms allowing the cassette module to be locked securely in place relative to the card cage.

8. An ATE system comprising:
   a CPU;
   I/O peripherals connected to the CPU;
   a remote test head electrically linked to the CPU, the test head comprising:
      a card cage having a first backplane that is mechanically and electrically connected to a first set of circuit cards, the first backplane is electrically coupled to a Central Processing Unit (CPU); and
      a cassette module mechanically joined to the card cage, the cassette module having a second backplane that is mechanically and electrically connected to a second set of circuit cards, the second backplane at least electrically connected to a Device Under Test (DUT) circuit board for interfacing with a DUT, the first set of circuit cards are in communications with the second set of circuit cards, any card from the second set of circuit cards is removable from the second backplane, the cassette module is removable from the card cage.

9. The ATE system of claim 8, wherein any card from the first set of circuit cards is removable from the first backplane.

10. The ATE system of claim 9, wherein the first set of circuit cards are general-purpose instrument cards and the second set of circuit cards are personality instrument cards.

11. The ATE system of claim 9, wherein the cassette module extends beyond the card cage to form a platform for holding the DUT circuit board, the platform having a cutout on a rear side allowing access to the second backplane, the platform further having a through hole in the second backplane thereby allowing visual contact and access to the DUT site.

12. The ATE system of claim 11, wherein the cutout has an access door so that when closed, the access door prevents light and electrical interference from affecting the DUT during various activities.

13. The ATE system of claim 9, wherein the card cage has a cavity and an access opening for accommodating the second set of circuit cards when the cassette module is mechanically joined to the card cage.

14. The ATE system of claim 13, wherein the cassette module is mechanically joined to the card cage by a pair of hook-pin mechanisms and a pair of latch mechanisms, wherein the cassette module is mechanically joined to the card cage by a pair of hook-pin mechanisms and a pair of latch mechanisms, wherein the hook-pin mechanisms allowing the card cage to pivot and freely swing close or open relative to the cassette module, the latch mechanisms allowing the cassette module to be locked securely in place relative to the card cage.

15. A method to configure an ATE test head to allow for rapid reconfiguration comprising:
   mechanically and electrically connecting a first set of circuit cards to a first backplane in a card cage, wherein any card of the first set of circuit cards is removable from the first backplane;
   mechanically and electrically connecting a second set of circuit cards to a second backplane in a cassette module, wherein any card of the second set of circuit cards is removable from the second backplane;
   electrically connecting the first set of circuit cards to the second set of circuit cards;
   at least electrically connecting a DUT circuit board to the second backplane; and
   mechanically joining the card cage to the cassette module such that the card cage is subsequently removable from the cassette module.

* * * * *